United States Patent
Mobasher et al.

(10) Patent No.: US 11,308,873 B2
(45) Date of Patent: Apr. 19, 2022

(54) REDUNDANCY ASSISTED NOISE CONTROL FOR ACCUMULATED ITERATIVE COMPRESSION ERROR

(71) Applicant: Samsung Display Co., Ltd., Yongin-si (KR)

(72) Inventors: Amin Mobasher, Palo Alto, CA (US); Zehui Chen, Los Angeles, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 139 days.

(21) Appl. No.: 16/542,233

(22) Filed: Aug. 15, 2019

(65) Prior Publication Data
US 2020/0372858 A1    Nov. 26, 2020

Related U.S. Application Data

(60) Provisional application No. 62/851,872, filed on May 23, 2019.

(51) Int. Cl.
*G09G 3/3225*    (2016.01)

(52) U.S. Cl.
CPC ... *G09G 3/3225* (2013.01); *G09G 2320/0257* (2013.01); *G09G 2320/0653* (2013.01); *G09G 2330/06* (2013.01)

(58) Field of Classification Search
CPC ......... G09G 3/3225; G09G 2320/0257; G09G 2330/06; G09G 2320/0653
See application file for complete search history.

(56) References Cited

U.S. PATENT DOCUMENTS

| | | | |
|---|---|---|---|
| 5,130,786 A * | 7/1992 | Murata | G06T 9/005 375/240.25 |
| 5,539,468 A | 7/1996 | Suzuki et al. | |
| 6,137,914 A | 10/2000 | Ligtenberg et al. | |
| 6,243,416 B1 | 6/2001 | Matsushiro et al. | |
| 6,668,086 B1 | 12/2003 | Enokida | |
| 6,819,793 B1 | 11/2004 | Reshetov et al. | |

(Continued)

FOREIGN PATENT DOCUMENTS

| KR | 10-2015-0034948 | 4/2015 |
|---|---|---|
| KR | 10-2019-0060909 A | 6/2019 |

OTHER PUBLICATIONS

Database Compendex [Online], Nov. 1976, Database accession No. EIX77090006481, 1 page.

(Continued)

*Primary Examiner* — Shaheda A Abdin
(74) *Attorney, Agent, or Firm* — Lewis Roca Rothgerber Christie LLP

(57) ABSTRACT

A method of stress compensation in a display device includes accumulating a brightness value of images displayed by the display device, encoding the accumulated brightness value to preserve a protected portion of the accumulated brightness value, compressing the accumulated brightness value, storing the compressed accumulated brightness value in a memory, retrieving and decompressing the compressed accumulated brightness value to generate a decompressed value, and decoding the decompressed value based on the protected portion to generate a decoded value corresponding to the accumulated brightness value, the decoded value having lower compression noise than the decompressed value.

19 Claims, 11 Drawing Sheets

(56) References Cited

U.S. PATENT DOCUMENTS

| | | |
|---|---|---|
| 7,202,912 B2 | 4/2007 | Aneja et al. |
| 7,236,636 B2 | 6/2007 | Sakai et al. |
| 7,321,693 B2 | 1/2008 | Kadowaki |
| 7,576,888 B2 | 8/2009 | Sakai et al. |
| 7,619,596 B2 | 11/2009 | Tada |
| 7,750,938 B2 | 7/2010 | Grimes et al. |
| 7,974,478 B2 | 7/2011 | Bashyam et al. |
| 8,452,083 B2 | 5/2013 | Kambegawa |
| 8,478,057 B1 | 7/2013 | Cui et al. |
| 8,509,532 B2 | 8/2013 | Ushiku |
| 8,533,166 B1 | 9/2013 | Sulieman et al. |
| 8,553,301 B2 | 10/2013 | Tamura |
| 8,599,925 B2 | 12/2013 | Srinivasan |
| 8,659,793 B2 | 2/2014 | Takeishi |
| 8,660,347 B2 | 2/2014 | Tamura |
| 8,994,617 B2 | 3/2015 | Chaji et al. |
| 8,995,763 B2 | 3/2015 | Clark |
| 9,071,838 B2 | 6/2015 | Cho et al. |
| 9,378,560 B2 | 6/2016 | Iourcha et al. |
| 9,495,894 B2 | 11/2016 | Yamanaka et al. |
| 9,584,696 B2 | 2/2017 | Beck |
| 9,697,765 B2 | 7/2017 | Chung et al. |
| 9,715,716 B2 | 7/2017 | Song et al. |
| 9,773,455 B2 | 9/2017 | Chung et al. |
| 9,812,067 B2 | 11/2017 | Yang et al. |
| 9,830,890 B2 | 11/2017 | Zhou et al. |
| 9,894,379 B2 | 2/2018 | Banerji et al. |
| 9,905,162 B2 | 2/2018 | Yoo |
| 9,966,035 B2 | 5/2018 | Kim et al. |
| 10,515,612 B2 | 12/2019 | Mobasher et al. |
| 2003/0043088 A1 | 3/2003 | Booth, Jr. et al. |
| 2004/0061672 A1 | 4/2004 | Page et al. |
| 2004/0153937 A1* | 8/2004 | Moon .................. H04N 19/895 714/746 |
| 2005/0225548 A1 | 10/2005 | Han et al. |
| 2005/0280766 A1 | 12/2005 | Johnson et al. |
| 2007/0230572 A1* | 10/2007 | Koto .................. H04N 19/12 375/240.12 |
| 2008/0048951 A1 | 2/2008 | Naugler et al. |
| 2008/0317362 A1 | 12/2008 | Hosaki et al. |
| 2009/0052772 A1 | 2/2009 | Speirs et al. |
| 2009/0066613 A1 | 3/2009 | Nakamura et al. |
| 2009/0148059 A1 | 6/2009 | Matsuda |
| 2010/0257493 A1 | 10/2010 | Agarwal et al. |
| 2010/0316137 A1 | 12/2010 | Long et al. |
| 2011/0069076 A1 | 3/2011 | Lindholm et al. |
| 2011/0148894 A1 | 6/2011 | Duprat et al. |
| 2011/0188750 A1 | 8/2011 | Tamura |
| 2011/0243469 A1 | 10/2011 | McAllister et al. |
| 2012/0120043 A1 | 5/2012 | Cho et al. |
| 2012/0147799 A1 | 6/2012 | Nagara et al. |
| 2012/0320067 A1 | 12/2012 | Iourcha et al. |
| 2013/0170558 A1 | 7/2013 | Zhang |
| 2014/0055500 A1 | 2/2014 | Lai |
| 2014/0160172 A1 | 6/2014 | Lee |
| 2014/0168192 A1 | 6/2014 | Jeong et al. |
| 2014/0176409 A1 | 6/2014 | Kim et al. |
| 2014/0313360 A1 | 10/2014 | Lee et al. |
| 2015/0002378 A1 | 1/2015 | Nathan et al. |
| 2015/0015590 A1 | 1/2015 | Jeong et al. |
| 2015/0117774 A1 | 4/2015 | Yang et al. |
| 2015/0194096 A1 | 7/2015 | Chung et al. |
| 2015/0243201 A1 | 8/2015 | Chung et al. |
| 2016/0104411 A1 | 4/2016 | Nathan et al. |
| 2016/0335741 A1 | 11/2016 | Zhao |
| 2016/0372033 A1 | 12/2016 | Yoo |
| 2016/0373788 A1 | 12/2016 | Gamei et al. |
| 2016/0379550 A1 | 12/2016 | Jiang et al. |
| 2017/0122725 A1 | 5/2017 | Yeoh et al. |
| 2017/0256024 A1 | 9/2017 | Abraham et al. |
| 2017/0256193 A1 | 9/2017 | Zhou et al. |
| 2019/0181191 A1 | 6/2019 | Chen |
| 2019/0289308 A1 | 9/2019 | Mobasher et al. |

OTHER PUBLICATIONS

Battail, Gerard, et al., "Decodage par repliques [Replication Coding]," with English Abstract, Annales Des Telecommunications, vol. 31, Nov. 1976, pp. 387-404.

EPO Extended Search Report dated Nov. 17, 2020, for corresponding European Patent Application No. 20169950.1, (32 pages).

Partial European Search Report for corresponding European Patent Application No. 20169950.1, dated Aug. 3, 2020, 31 pages.

Notice of Allowance issued in U.S. Appl. No. 15/983,014 by the USPTO, dated Aug. 28, 2019, 7 pages.

Office Action issued in U.S. Appl. No. 15/980,623 by the USPTO, dated Feb. 4, 2020, 6 pages.

Burrows, M., et al., "A Block-sorting Lossless Data Compression Algorithm", SRC Research Report 124, May 10, 1994, 24 pages, d i g i t a l Systems Research Center, Palo Alto, California.

"Burrows-Wheeler Transform CMSC 423", 2009, 26 pages.

EPO Extended Search Report dated Mar. 6, 2020, for corresponding European Patent Application No. 19191346.6, 8 pages.

Office Action issued in U.S. Appl. No. 16/292,181 by the USPTO, dated Apr. 9, 2020, 7 pages.

Syahrul, Elfitrin, et al., "Lossless Image Compression Using Burrows Wheeler Transform (Methods And Techniques)", 2008 IEEE International Conference on Signal Image Technology and Internet Based Systems, 2008, pp. 338-343.

Kang, Wei, et al., "Compressing Encrypted Data: A Permutation Approach", Fiftieth Annual Allerton Conference Allerton House, UIUC, Illinois, USA, Oct. 2012 (IEEE), (5 pages).

EPO Extended Search Report dated May 2, 2019, for corresponding European Patent Application No. 19162833.8 (15 pages).

U.S. Office Action dated Aug. 19, 2021, issued in U.S. Appl. No. 16/657,803 (12 pages).

EPO Extended Search Report dated Nov. 10, 2020, issued in European Patent Application No. 20195820.4 (10 pages).

* cited by examiner

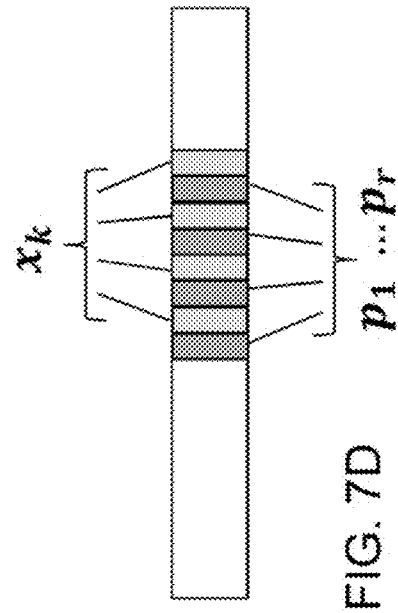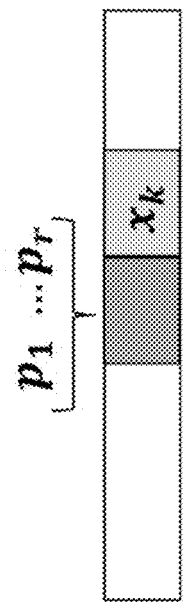
FIG. 7A
FIG. 7B
FIG. 7C
FIG. 7D

REDUNDANCY ASSISTED NOISE CONTROL FOR ACCUMULATED ITERATIVE COMPRESSION ERROR

CROSS-REFERENCE TO RELATED APPLICATION(S)

The present application claims priority to and the benefit of U.S. Provisional Patent Application Ser. No. 62/851,872, filed May 23, 2019 and entitled "REDUNDANCY ASSISTED NOISE CONTROL FOR ACCUMULATED ITERATIVE COMPRESSION ERROR," the entire content of which is hereby expressly incorporated by reference.

The present application is also related to U.S. patent application Ser. No. 15/980,623, filed May 15, 2018 and entitled "PERMUTATION BASED STRESS PROFILE COMPRESSION," which claims priority to and the benefit of U.S. Provisional Patent Application Ser. No. 62/643,630, filed Mar. 15, 2018 and entitled "PERMUTATION BASED STRESS PROFILE COMPRESSION," the entire contents of which are hereby expressly incorporated by reference.

FIELD

Aspects of the present disclosure relate to stress compensation or image sticking or ghosting effect in a display device.

BACKGROUND

Compensation for output decline in a video display such as an organic light-emitting diode (OLED) display may be used to preserve image quality as a display ages. The data used to perform such compensation may be stored in compressed form to reduce memory requirements; however, errors in such compressed data may accumulate unevenly, resulting in loss of image quality.

Additionally, when an OLED display device displays a static image for a prolonged period of time, it may suffer from image retention. The result is that once the static image is removed or changed, a faint outline—or ghosting—of the original image may still be visible to a user, even when the image content has changed. This is often referred to as image sticking, image retention, or image ghosting. The same method as stress profile is applied for image sticking.

Thus, there is a need for an improved system and method for stress compensation.

The above information disclosed in this Background section is only for enhancement of understanding of the background of the disclosure and therefore it may contain information that does not constitute prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a system and a method for reducing or eliminating display output decline by mitigating the effects of pixel degradation/aging in a display device.

According to some embodiments of the present disclosure, there is provided a method of stress compensation in a display device, the method including: accumulating, by an adding circuit, a brightness value of images displayed by the display device; encoding, by an encoder, the accumulated brightness value to preserve a protected portion of the accumulated brightness value; compressing, by a compressor, the accumulated brightness value; storing, by the compressor, the compressed accumulated brightness value in a memory; retrieving and decompressing, by the decompressor, the compressed accumulated brightness value to generate a decompressed value; and decoding, by a decoder, the decompressed value based on the protected portion to generate a decoded value corresponding to the accumulated brightness value, the decoded value having lower compression noise than the decompressed value.

In some embodiments, the protected portion includes k bits of the accumulated brightness value starting from a p-th bit of the accumulated brightness value (both p and k being integers greater than 1), and p+k−1 is less than a bit length of the accumulated brightness value.

In some embodiments, the compression noise in the decompressed value is entirely contained within a first (p+k−1)-th bits of the decompressed value.

In some embodiments, the method further includes discarding, by a truncator, lesser significant bits of the decoded value preceding the protected portion.

In some embodiments, the method further includes providing the decoded value to a compensator for compensating an input image for a stress of the display device.

In some embodiments, the encoding the accumulated brightness value includes: identifying, by the encoder, the protected portion of the accumulated brightness value; and storing, by the encoder, the protected portion in the memory.

In some embodiments, the protected portion is stored in memory in an uncompressed state.

In some embodiments, the decoding the decompressed value includes:

identifying, by the decoder, a decompressed protected portion of the decompressed value; calculating, by the decoder, a difference between the protected portion and the decompressed protected portion to generate an estimated compression noise; and calculating, by the decoder, the decoded value based on the decompressed value and the estimated compression noise to mitigate compression noise in the decompressed value.

In some embodiments, the decompressed protected portion of the decompressed value corresponds in bit position to the protected portion of the accumulated brightness value.

In some embodiments, the calculating the difference includes: calculating, by the decoder, a first error ($E_1$) and a second error ($E_2$) as: $E_1=(\tilde{x}_k-x_k) \bmod 2^k$ and $E_2=(x_k-\tilde{x}_k) \bmod 2^k$, where $x_k$ represents the protected portion of the accumulated brightness value, $\tilde{x}_k$ represents the decompressed protected portion, and mod represents a modulo operation.

In some embodiments, calculating the decoded value includes: determining, by the decoder, that the first error is less than the second error; and in response to the determination, calculating, by the decoder, the decoded value (g) as $\tilde{X}=\tilde{X}-E_1 \cdot 2^{p-1}$, where $\tilde{E}$ represents the decompressed value and p represents a first bit location of the protected portion in the accumulated brightness value.

In some embodiments, calculating the decoded value includes: determining, by the decoder, that the first error is greater than the second error; and in response to the determination, calculating, by the decoder, the decoded value ($\tilde{X}$)

as $\hat{X}=\tilde{X}+Ehd\ 2\cdot 2^{p-1}$, where $\tilde{X}$ presents the decompressed value and p represents a first bit location of the protected portion in the accumulated brightness value.

In some embodiments, calculating the decoded value includes: determining, by the decoder, that the first error is equal to the second error; and determining, by the decoder, the decoded value as the decompressed value.

In some embodiments, the encoding the accumulated brightness value includes: replicating, by the encoder, the protected portion of a plurality of times to form a binary replica string, and wherein the method further includes: compressing, by the compressor, the binary replica string; storing, by the compressor, the compressed binary replica string in the memory; and retrieving and decompressing, by the decompressor, the compressed binary replica string to generate a decompressed binary replica string.

In some embodiments, the decoding the decompressed value includes: calculating, by the decoder, a decoded protected portion to estimate the protected portion by applying a maximum likelihood decoding (MLD) process to the decompressed binary replica string; calculating, by the decoder, a difference between the decoded protected portion and a decompressed protected portion of the decompressed value to generate an estimated compression noise; and calculating, by the decoder, the decoded value based on the decompressed value and the estimated compression noise to mitigate compression noise in the decompressed value.

In some embodiments, the encoding the accumulated brightness value includes: coding, by the encoder, the protected portion to generate a plurality of parity bits, wherein the compressing the accumulated brightness value includes: compressing, by the compressor, the parity bits along with the accumulated brightness value, and wherein the decompressing the compressed accumulated brightness value includes: decompressing, by the decompressor, the compressed binary parity bits together with the compressed accumulated brightness value to generate a decompressed protected portion and decompressed parity bits.

In some embodiments, the coding of the protected portion is according to a reed-solomon code applied across slices of the accumulated brightness value, and wherein the parity bits are compressed via a different compression than the accumulated brightness value.

In some embodiments, the decoding the decompressed value includes: calculating, by the decoder, a decoded protected portion to estimate the protected portion based on the decompressed protected portion and decompressed parity bits; calculating, by the decoder, a difference between the decoded protected portion and the decompressed protected portion to generate an estimated compression noise; and calculating, by the decoder, the decoded value based on the decompressed value and the estimated compression noise to mitigate compression noise in the decompressed value.

According to some embodiments of the present disclosure, there is provided a method of stress compensation in a display device, the method including: accumulating, by an adding circuit, a brightness value of the output image with displayed by the display device; encoding, by an encoder, the accumulated brightness value to preserve a protected portion of the accumulated brightness value; compressing, by a compressor, the accumulated brightness value; storing, by the compressor, the compressed accumulated brightness value in a memory; retrieving and decompressing, by the decompressor, the compressed accumulated brightness value to generate a decompressed value; decoding, by a decoder, the decompressed value based on the protected portion to generate a decoded value corresponding to the accumulated brightness value, the decoded value having lower compression noise than the decompressed value; receiving, by the adding circuit, an output image to be displayed on the display device; adding, by the adding circuit, the decoded value to a brightness value of the output image to generate an updated accumulated brightness value.

According to some embodiments of the present disclosure, there is provided a system for performing stress compensation in a display device, the system including: a memory; and a processing circuit configured to perform: accumulating a brightness value of images displayed by the display device; encoding the accumulated brightness value to preserve a protected portion of the accumulated brightness value; compressing the accumulated brightness value; storing the compressed accumulated brightness value in the memory; retrieving and decompressing the compressed accumulated brightness value to generate a decompressed value; and decoding the decompressed value based on the protected portion to generate a decoded value corresponding to the accumulated brightness value, the decoded value having lower compression noise than the decompressed value.

BRIEF DESCRIPTION OF THE DRAWINGS

These and other features of some example embodiments of the present disclosure will be appreciated and understood with reference to the specification, claims, and appended drawings, wherein:

FIGS. 7A-7D illustrate various placement options for the insertion of parity bits into the corresponding accumulated brightness value, according to some example embodiments of the present disclosure.

DETAILED DESCRIPTION

Figure 1:
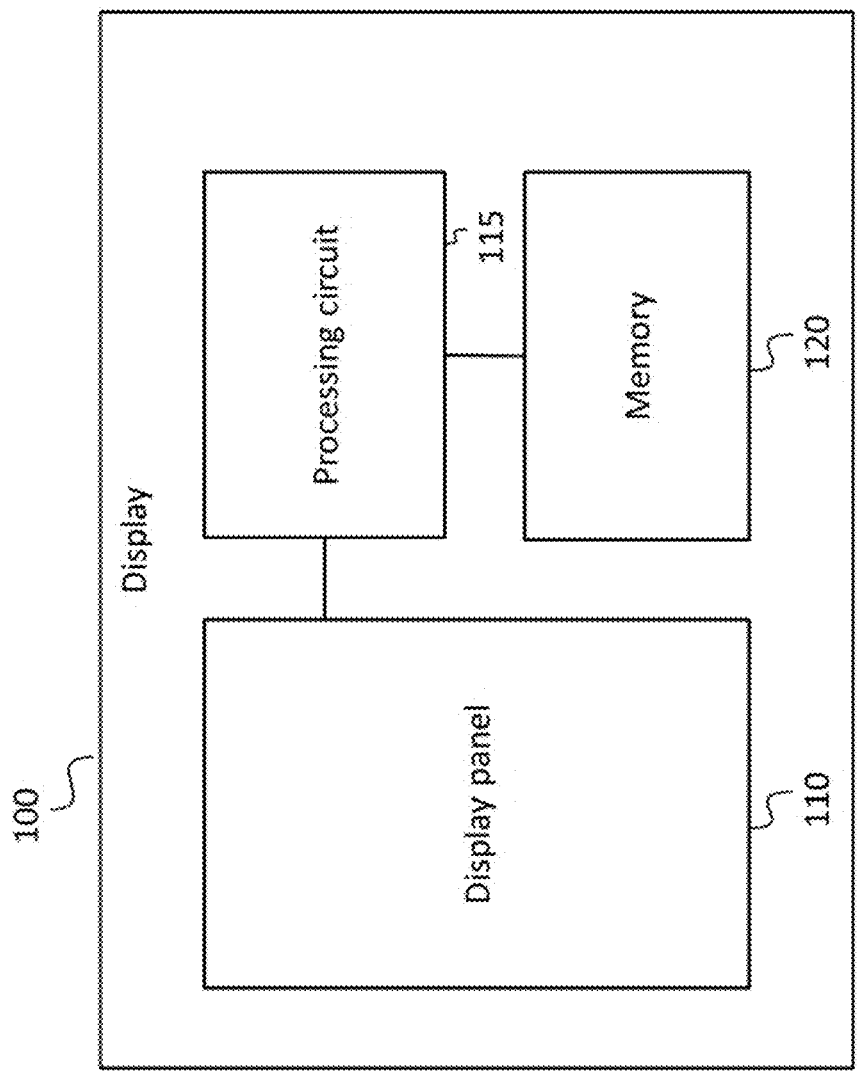
FIG. 1 illustrates an example embodiment of a display device, according to some example embodiments of the present disclosure.

The detailed description set forth below in connection with the appended drawings is intended as a description of some example embodiments of a system and a method for mitigating the effects of compression errors provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Certain kinds of display devices may have characteristics that change with use. For example, an organic light-emitting diode (OLED) display device may include a display panel having a plurality of pixels, each including several subpixels (e.g., a red subpixel, a green subpixel, and a blue subpixel), and each of the subpixels may include an organic light-emitting diode configured to emit a different respective color. Each organic light-emitting diode may have an optical efficiency that declines with use, so that, for example, after the organic light-emitting diode has been in operation for some time, the optical output at a certain current may be lower than it was, at the same current, when the organic light-emitting diode was new.

This reduction in optical efficiency may result in dimming of parts of a display panel that have on average, during the life of the display device, displayed brighter portions of the displayed images than other parts of the display. For example, a display device used to view largely unchanging images from a security camera, the field of view of which contains a scene having a first portion that is sunlit, and relatively bright, during most of the day, and a second portion that is in the shade and relatively dim, during most of the day, may eventually show a more significant decrease in optical efficiency in the first portion than in the second portion. The fidelity of image reproduction of such a display device may degrade over time as a result. As another example, a display device that is used part of the time to display white text at the bottom of the image, separated by a black margin from the rest of the image, may experience a lower reduction of optical efficiency in the black margin than in other parts of the display panel, so that if the display device is later used in a mode in which a scene fills the entire display panel, a brighter band may appear where the black margin was previously displayed. This may be referred to as image sticking or ghosting.

To reduce the effect of such non-uniformities in the optical efficiency of a display device, a display device may include features to compensate for the reduction of optical efficiency resulting from use of the display.

FIG. 1 illustrates an example embodiment of a display device 100. Display device 100 may include a display panel 110, a processing circuit 115 (e.g., a processor or a central processing unit (CPU)), and a memory 120. The memory 120 includes data that may be referred to as a "stress profile" or "stress table" for the display device 100. The "stress profile" or "stress table" stored on the memory 120 may be a table of numbers or "stress values" indicating the amount of stress each sub-pixel in the display device 100 has been subjected to during the life of the display device 100. The "stress" may be the total (e.g., time-integrated) drive current that has flowed through each sub-pixel during the life of the display device 100 or sum total of the brightness values displayed. For example, the "stress" may be the total charge that has flowed through each sub-pixel during the life of the display device 100.

In some example embodiments, the method of determining the "stress profile" may be a data driven method to compensate for OLED output decline. In some example embodiments, in order to determine the "stress profile" of the display device 100, the memory 120 may accumulate one number for one or some sub-pixels, each time a new image is displayed in the display device 100 as a new entry in the "stress profile" or "stress table" for the display device 100. For example, as a continuous stream of images together form displayed video in the display device 100, the drive current for each sub-pixel in each image may be measured and a number indicating the current or brightness of the subpixel may be added to the respective number or "stress" for that sub-pixel in "stress profile" or "stress table" in the memory 120. In some examples, the stress value for each sub-pixel may be calculated as the total sum of the brightness values displayed by the sub-pixel.

In some example embodiments, a display device 100 includes a timing controller and a plurality of driver integrated circuits (e.g., a scan/gate driver and a data driver). The processing circuit 115 may be, or may be part of, one or more of the driver integrated circuits. In some embodiments, each driver integrated circuit is responsible for driving a portion of the display panel 110, and it may accordingly perform stress accumulation and stress compensation for that portion, independently of the other driver integrated circuits.

In some example embodiments, during operation of the display device 100, the drive current to each sub-pixel may be adjusted to compensate for an estimated loss of optical efficiency. The estimated loss of optical efficiency may be based on the lifetime stress of the sub-pixel. For example, the drive current to each sub-pixel may be increased in accordance with (e.g., in proportion to) the estimated loss of optical efficiency of the sub-pixel (e.g., as accumulated in the memory 120), so that the optical output of the sub-pixel may be substantially the same as it would have been had the optical efficiency of the sub-pixel not been reduced, and had the drive current not been increased. In some example embodiments, a non-linear function based on empirical data or a model of the physics of the sub-pixel may be used to infer or predict the loss of optical efficiency expected to be present, based on the lifetime stress of the sub-pixel. The calculations of the predicted loss of optical efficiency, and of the accordingly adjusted drive current, may be performed by the processing circuit 115. In some embodiments, the calculations are stored in a look up table in the memory and the processing circuit 115 may use it for compensation. In some example embodiments, during operation of the display device 100, the drive current to each sub-pixel may be adjusted according to a compensation factor, which may be calculated based on an accumulated brightness captured from output image of the sub-pixel.

Figure 2A:
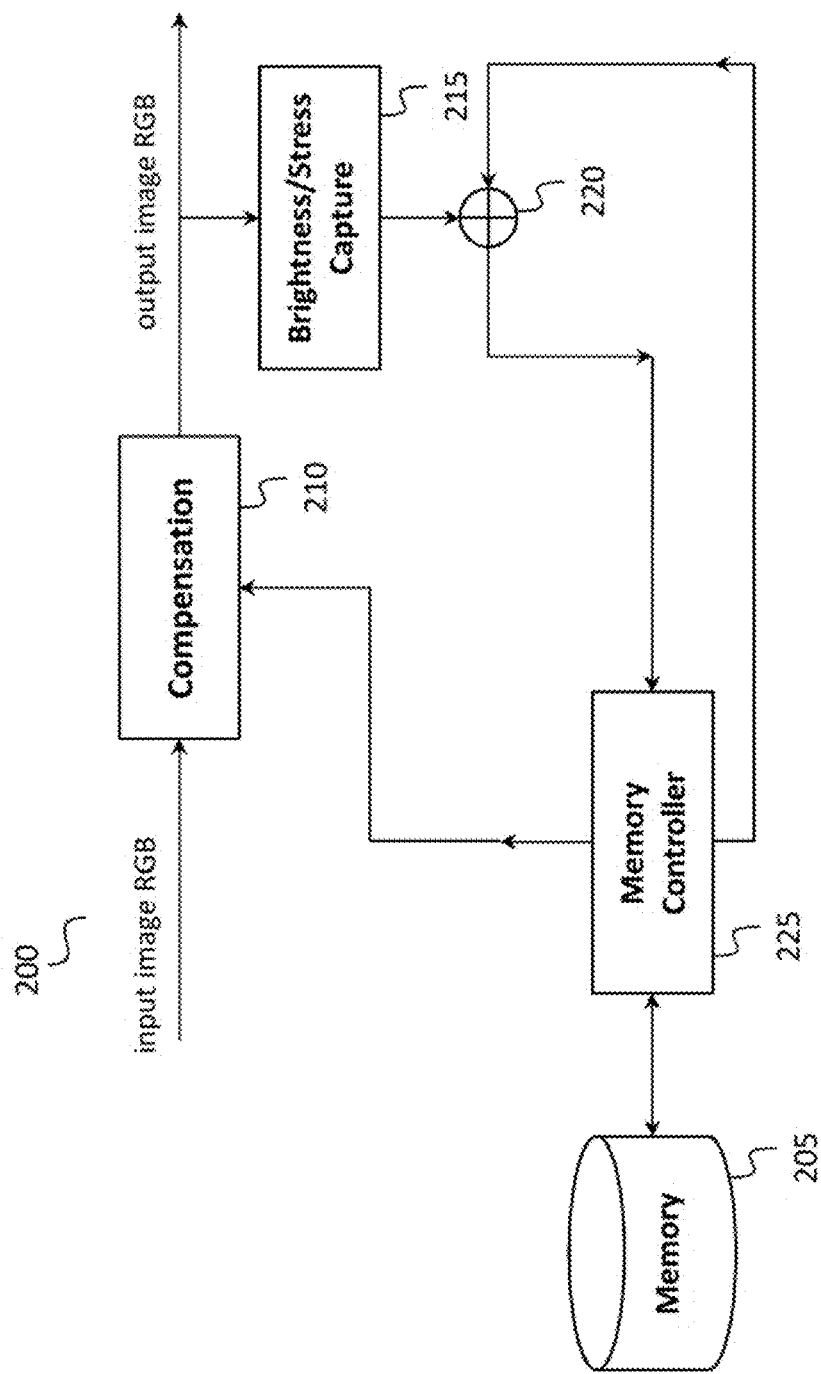
FIG. 2A illustrates a block diagram of a system for stress compensation, according to some example embodiments of the present disclosure.

FIG. 2A illustrates a block diagram of a system 200 for stress compensation, according to some embodiments of the present disclosure. The system 200 includes a memory 205 (which may be the same as, or be a part of, the memory 120), a compensation module 210, a stress capture module 215, an adding circuit 220, and a memory controller 225. The stress table is stored in the memory 205. In operation, stress values in the stress table may be accessed (e.g., read out) via the memory controller 225 and may be used by the compensation module 210 to determine compensation factors for the sub-pixels. The compensation module 210 may include a drive current adjustment circuit to calculate adjusted drive current values for each sub-pixel based on the respective compensation factor of that sub-pixel. The compensation factor for each sub-pixel is based on the stress value of that sub-pixel. In some example embodiments, the adjusted drive current value for each sub-pixel may be a raw drive current value (e.g., based on the desired optical output of the sub-pixel), adjusted according to the accumulated stress of the sub-pixel. The adjusted drive current value for each sub-pixel is read by the stress capture module 215, which may include a sub-pixel stress sampling circuit. The adjusted drive current value for each sub-pixel represents the current rate of accumulation of stress of the sub-pixels being displayed. Each previously stored (e.g., in the memory 205) stress value for each sub-pixel is increased (or "augmented") in an adding circuit 220 based on the current rate of accumulation of stress (e.g., by a number proportional to the adjusted drive current value), and saved back to the memory 205 via the memory controller 225. The memory controller 225 controls read and write operations in the memory 205 and feeds the stress values from the memory 205 to the drive current adjustment circuit of the compensation module 210 and to the adding circuit 220 as needed. The memory controller 225 also stores the augmented stress values, which have been augmented by the addition of the current rate of accumulation of stress at the adding circuit 220, back into memory 205.

In some example embodiments, tracking the total stress of each sub-pixel may require a significant amount of memory. For example, for a display with 1920×1080 pixels, with three sub-pixels per pixel, and with the stress of each sub-pixel stored in a few byte numbers, the size of the memory required may be in the order of tens of megabytes. Moreover, the computational burden of updating each stress number for each sub-pixel for each frame of video (e.g., for each displayed image) is significant.

Various approaches may be used to reduce the burden of tracking, and correcting for the reduction in optical efficiency resulting from, sub-pixel stress. For example, the sub-pixel stress sampling circuit in the stress capture module 215 may sample only a subset of the adjusted drive current values in each image (e.g., in each frame of video). For example, in a display having 1080 lines (or rows) of pixels, if the scene changes relatively slowly in the video being displayed, only one row of the stress table is updated per frame of video. The discarding of the intervening 1079 adjusted drive current values for any sub-pixel may result in only a small, acceptable loss of accuracy in the resulting stress values (e.g., as a measure of the lifetime stress value) of the sub-pixel. In another embodiment, the sub-pixel stress sampling circuit in the stress capture module 215 may in addition sample only at subset of frames. For example, in a display having 1080 lines (or rows) with refresh rate of 60 Hz (e.g., showing 60 frames per minute), the stress sampling circuit in the stress capture module 215 samples all or partial drive current values in the image once every 10 frames and the stress table is updated accordingly.

Various approaches may also be used to reduce the memory size required for storing sub-pixel stress in the stress table. For example, the memory on the stress profile chipset may be reduced by compressing the data stored in the memory.

Figure 2B:
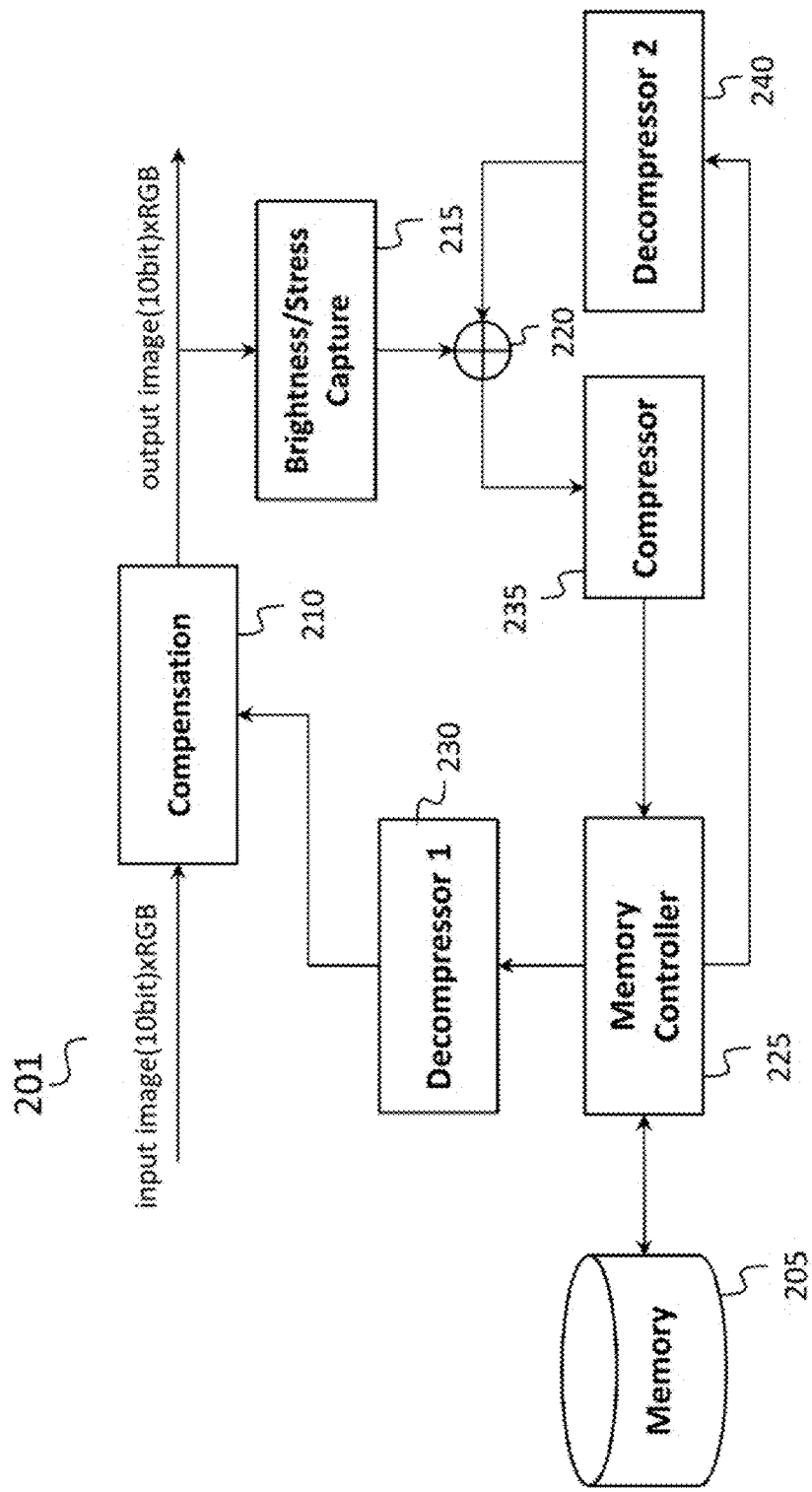
FIG. 2B illustrates a block diagram of a system for stress compensation using memory compression, according to some example embodiments of the present disclosure.

FIG. 2B illustrates a block diagram of a system 201 for stress compensation using memory compression. The system 201 includes all the components of FIG. 2A. The system 201 also includes a first decompressor 230, a compressor 235, and a second decompressor 240. In some example embodiments, a compressed representation of the stress table is stored in the memory 205. In operation, compressed stress data may be accessed (e.g., read out) via the memory controller 225 and may be decompressed by the first decompressor 230 before being fed to the drive current adjustment circuit of the compensation module 210. The drive current adjustment circuit of the compensation module 210 calculates the adjusted drive current values for each sub-pixel based on the respective compensation factor of that sub-pixel. The compensation factor for each sub-pixel is based on the stress value of that sub-pixel. The adjusted drive current value for each sub-pixel is read by the stress capture module 215. The adjusted drive current value for each sub-pixel represents the current rate of accumulation of stress of the sub-pixels being displayed. The compressed stress data in the memory 205 are also decompressed by a second decompressor 240 to retrieve each previously stored (e.g., in the memory 205) stress value for each sub-pixel. The decompressed stress values for the sub-pixel from the second decompressor 240 are sent to the adding circuit 220. Each previously stored stress value for each sub-pixel is increased (or "augmented") in the adding circuit 220 based on the current rate of accumulation of stress (e.g., by a number proportional to the adjusted drive current value). The augmented stress values from the adding circuit 220 are compressed by a compressor 235, before being stored in the memory 205. The compressor 235 compresses data that it receives in a manner that reduces the size of the stored data. In some examples, the compression applied by the compressor may be lossy, in order to reduce (e.g., minimize) the amount of memory capacity consumed by the compressed data. Each of the first decompressor 230 and the second decompressor 240 decompresses the received data. For example, each of the first decompressor 230 and the second decompressor 240 performs an operation that inverts, or approximately inverts, the operation performed by the compressor 235. Various methods of compression may be employed, including entropy coding, such as Huffman coding or arithmetic coding.

The system 201 of FIG. 2B may reduce the memory size required for storing sub-pixel stress in the stress table. However, due to the iterative nature of the system, errors can accumulate in the memory or the stress table, as compared to a system (e.g., 200) which does not use compression. The iterative additive nature of the stress profile causes the compression and decompression error to accumulate from one iteration to the next. This error pattern may be similar from iteration to iteration. In some examples, such error may be too high to effectively correct using traditional error correction codes.

Figure 2C:
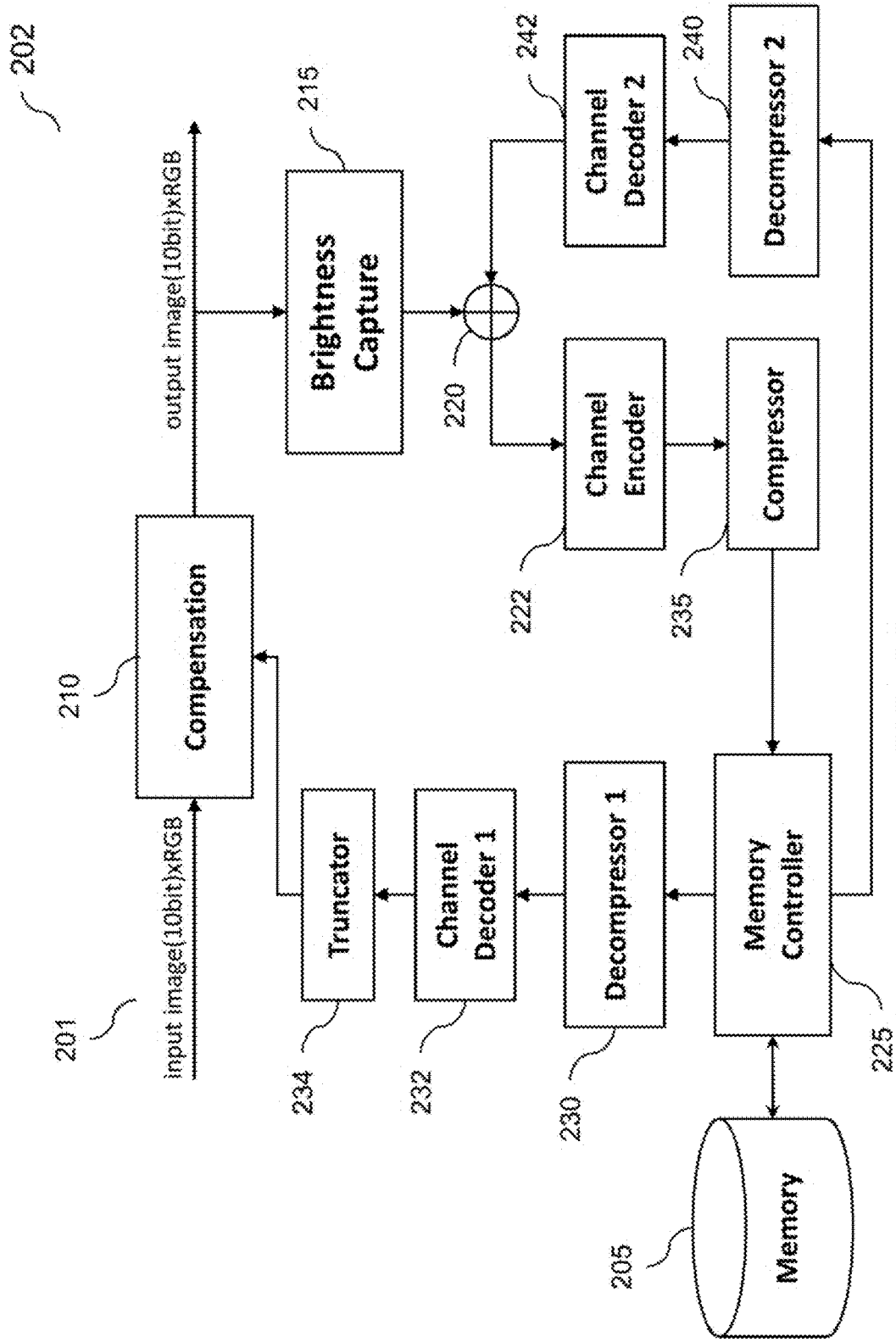
FIG. 2C illustrates a block diagram of a system for stress compensation using redundancy assisted noise control for accumulated iteration compression error, according to some example embodiments of the present disclosure.

FIG. 2C illustrates a block diagram of a system 202 for stress compensation using redundancy assisted noise control for accumulated iteration compression error, according to some embodiments of the present disclosure.

Referring to FIG. 2C, according to some embodiments, the system 202 includes all the components of FIG. 2A. The system 202 also includes an encoder (e.g., a channel encoder) 222, a first channel decoder 222, a second channel decoder 242, and a truncator 234. In some embodiments, the encoder 222 encodes the accumulated brightness value (also referred to as "accumulated stress value") it receives from the adding circuit 220 to protect (e.g., preserve) a portion of the brightness value that is later used to mitigate noise. The protected portion of the brightness value may be a k bits (k being an integer greater than 1) near the middle portion of the brightness value, as will be discussed below. The encoder 222 may store a duplicate copy of the protected portion in the memory 205 for later use by the first and second channel decoders 232 and 242. In some examples, the duplicate portion may be stored in an uncompressed form, may be compressed using lossless/lossy compression prior to storing in memory (e.g., by the compressor 235), or a coded version of the protected portion may be stored in memory. Each of the channel decoders 232 and 242 may utilize the protected portion stored in the memory 205 to reduce the compression noise arising from the compression and decompression operations respectively performed by the compressor 235 and a corresponding one of the decompressors 230 and 240. Without the use of the channel encoder 222 and decoders 232 and 242, because of the iterative nature of the stress profile, the compression/decompression error may increase over time and propagate from the lesser significant bit locations to the more significant bit locations. When k bits of the brightness value are preserved, according to some embodiments of the present disclosure, there may be no errors in the rest of the more significant bit locations.

The truncator 234 may discard a portion of the output of the first channel decoder 232. In some embodiments, the truncator 234 discards the lesser significant bits preceding the protected portion of the brightness value to reduce or minimize accumulated error.

Figure 3:
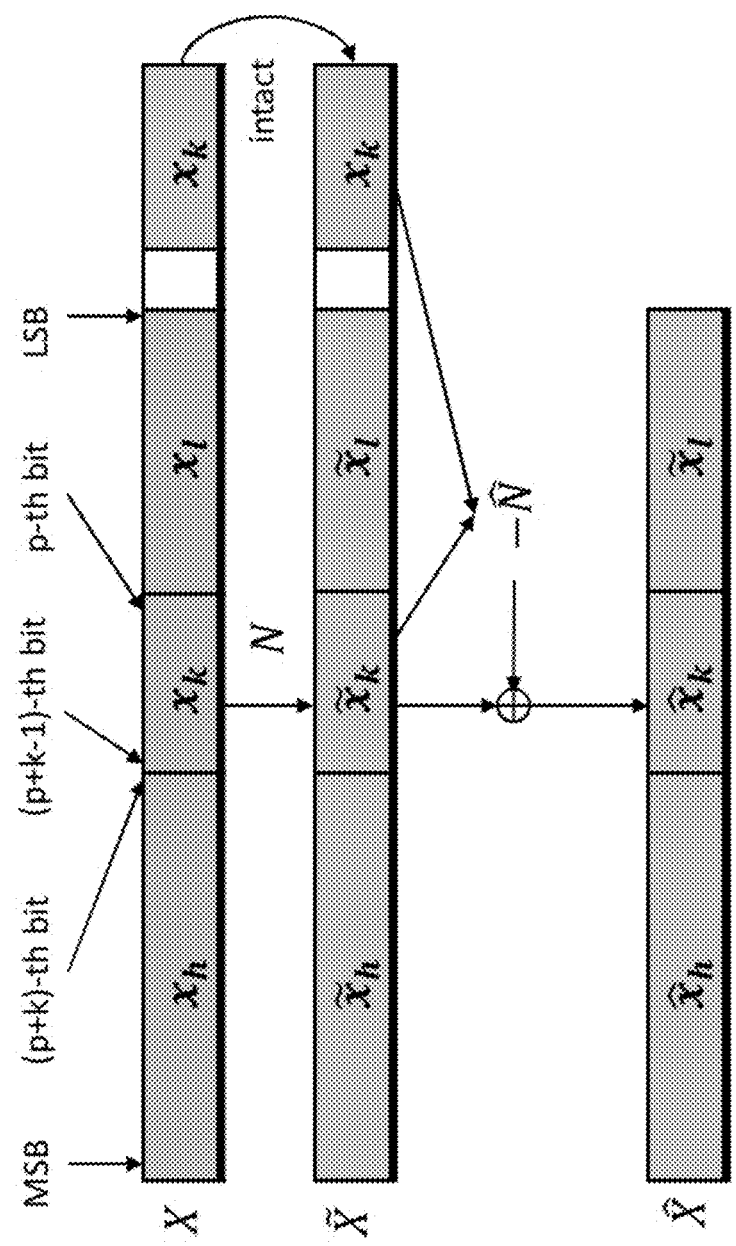
FIG. 3 illustrates a process for mitigating noise through partial protection of bits by the system 202, according to some example embodiments of the present disclosure.

FIG. 3 illustrates a process for mitigating noise through partial protection of bits by the system 202, according to some embodiments of the present disclosure.

Referring to FIG. 3, in some embodiments, the encoder 222 may select k bits of the accumulated brightness value X beginning at the start bit p as the protected portion $x_k$, where both p and k are positive integers greater than one. The lesser significant portion $x_l$, which is represented by bits from the least significant bit to bit p−1, of the accumulated brightness value X may later be discarded by the truncator 234. The values p and k are chosen such that the range of compression/decompression noise is within the protected and lesser significant portions $x_k$ and $x_l$, that is, it is limited to the first to (p+k−1)-th bits of the accumulated brightness value X. The value of p+k−1 may be less than a bit length of the accumulated brightness value. In some examples, the length k of the protected portion $x_k$ may be 4 to 6, and the value p may be between 6 and 8; however, embodiments of the present disclosure are not limited thereto. According to some embodiments, ignoring the errors that occur in the lesser significant portion $x_l$, protecting the partial information contained in the protected portion $x_k$, and performing error correction using the partial information is sufficient to significantly reduce or to minimize error propagation to the more significant portion $x_h$ of the accumulated brightness value X, which is represented by bits from the (p+k)-th bit to the most significant bit.

As shown in FIG. 3, the output of the decompressor 230 is represented by the decompressed accumulated brightness value $\tilde{X}$ (also referred to as "the decompressed value"), and the output of the first channel decoder 232 is represented by the decoded accumulated brightness value $\hat{X}$ (also referred to as "the decoded value"). It is desirable for the decoded value $\hat{X}$ to be as close to the original accumulated brightness value X as possible.

Here, the decompressed value $\tilde{X}$ includes the compressed protected portion $\tilde{x}_k$, the compressed lesser significant portion $\tilde{x}_l$, and the compressed more significant portion $\tilde{x}_h$; and the decoded value $\hat{X}$ includes the decoded protected portion $\hat{x}_h$, the decoded lesser significant portion $\hat{x}_l$, and the decoded more significant portion $\hat{x}_h$. The accumulated brightness value X and the decompressed value $\tilde{X}$ may be related through Equation 1:

$$\tilde{X} = X + N \quad \text{(Equation 1)}$$

where N represents the compression noise added to the original value X through the compression and decompression operations performed by the compressor 235 and second decompressor 230, respectively. The first channel decoder 232 estimates the compression noise based on the protected portion $x_k$, which may be maintained intact by the channel encoder and generates an estimated noise $\hat{N}$. The first channel decoder 232 uses the estimated noise $\hat{N}$ to generate the decoded value $\hat{X}$. For this operation to be performed, the values k and p are chosen such that they satisfy the condition of Equation 2 (assuming maximum value of noise N is known, but the sign of N is unknown) or the condition of Equation 3 (assuming both maximum value of noise N and its sign are known):

$$k+p-1 > \log_2(|N|) \quad \text{(Equation 2)}$$

$$k+p-2 > \log_2(|N|) \quad \text{(Equation 3)}$$

where |N| represents the absolute value of the compression noise N. The condition Equation 3 is more conservative than the condition Equation 2, as satisfying Equation 3 automatically guarantees satisfying Equation 2. Under the condition of Equation 1, there are two candidates N (with the first p−1 bits ignored), which can be expressed as:

$$\hat{N}_1 = (\hat{x}_k - x_k) \times 2^{p-1}, \text{ or } \hat{N}_2 = 2^{p+k-1} + (\hat{x}_k - x_k) \times 2^{p-1} \quad \text{(Equation 4)}$$

where, for simplicity, it is assumed that $\hat{x}_k \geq x_k$. To uniquely determine among the two candidates N, one is required to satisfy:

$$X + \text{div}(N, 2^{(p-1)}) \neq X - \text{div}(N, 2^{(p-1)}) \mod 2^k \quad \text{(Equation 5)}$$

Once a decision is made as to the estimated noise $\hat{N}$ (with ambiguity in the first p−1 bits), compression can be compensated for. Thus, for each iteration, the decoded value $\hat{X}$ may satisfy Equation 6:

$$|\hat{X} - X| < 2^{p-1} \quad \text{(Equation 6)}$$

That is, the compression noise per iteration is limited to the lesser significant portion $x_l$, which is disregarded.

Figure 4:
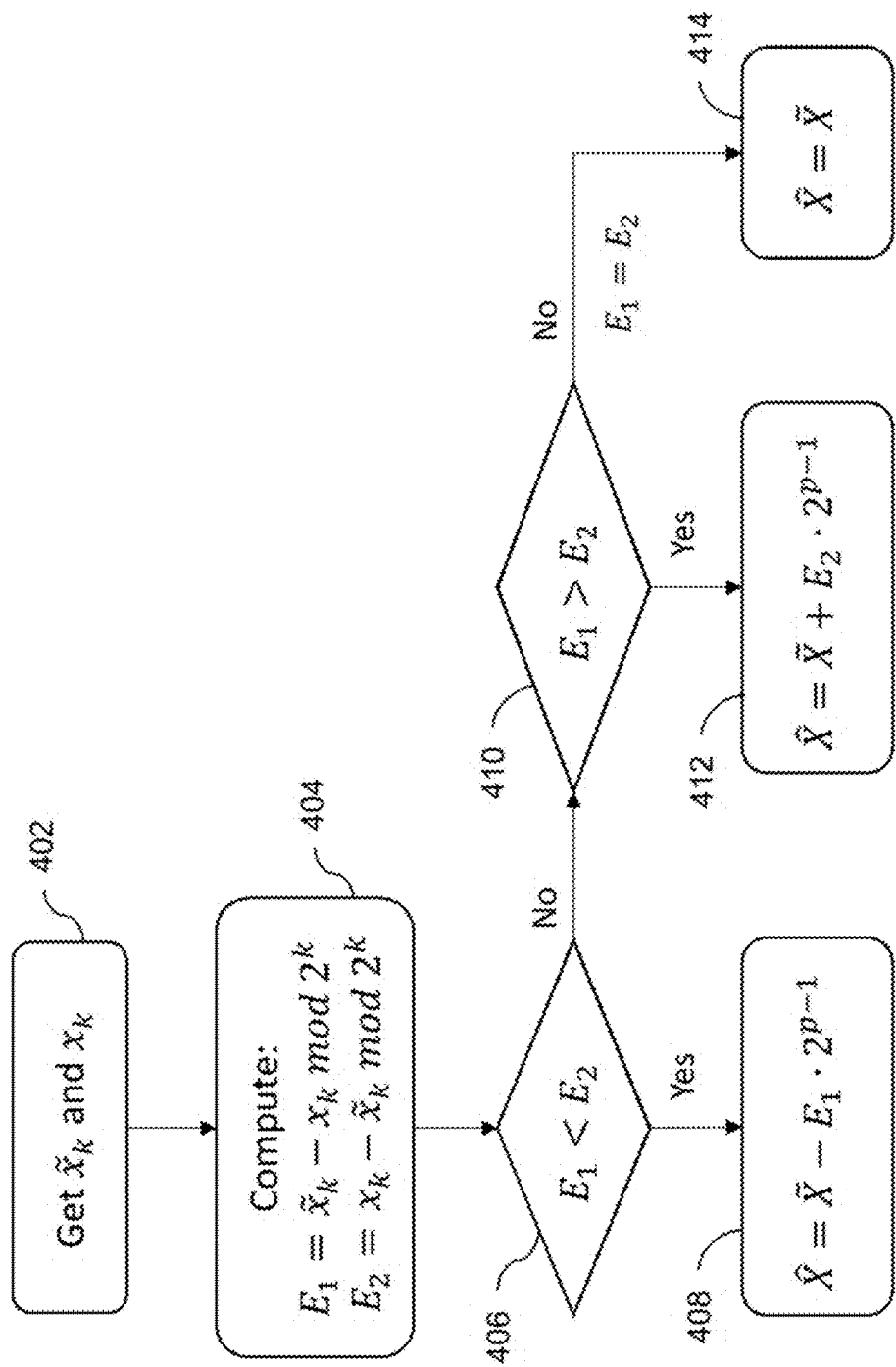
FIG. 4 is a flow diagram illustrating the process for mitigating noise by the noise mitigation system, according to some example embodiments of the present disclosure.

FIG. 4 is a flow diagram illustrating the process 400 for mitigating noise by the system 202, according to some embodiments of the present disclosure.

Referring to FIG. 4, in block 402, the channel decoder 232/242 obtains the protected portion $x_k$ from the memory 205 and the compressed protected portion $\hat{x}_k$ from the second decompressor 230. In block 404, the channel decoder 232/242 calculates the first error value E1 and the second error value E2 according to Equations 7 and 8:

$$E_1 = (\tilde{x}_k - x_k) \mod 2^k \quad \text{(Equation 7)}$$

$$E_2 = (x_k - \tilde{x}_k) \mod 2^k \quad \text{(Equation 8)}$$

where the expression "a mod b" is the remainder of Euclidian division of integer a by integer b. The values $E_1$ and $E_2$ represent the noise added to the k bits of the protected portion $x_k$. The first error $E_1$ represents a scenario in which the compression noise N has a positive value, and the second error $E_2$ represents a scenario in which the compression noise N has a negative value. In FIG. 4, it is assumed that only the weaker condition in Equation 2 (and not Equation 3) is satisfied. In such a scenario, there may be the two possible noise values $E_1$ and $E_2$ (corresponding to the noise values in Equations 4 and 5) and the channel decoder 232/242 determines which one of $E_1$ or $E_2$ is the correct noise, which should be compensated.

In block 406, the channel decoder 232/242 determines if the first error $E_1$ is less than the second error $E_2$. If so, in block 408, the channel decoder 232/242 calculates the decoded value ĝ according to Equation 9:

$$\hat{X} = \tilde{X} - E_1 \cdot 2^{p-1} \quad \text{(Equation 9)}$$

If not, in block 410, the channel decoder 232/242 determines whether the first error E1 is equal to the second error E2. If not (i.e., E1>E2), in block 412, the channel decoder 232/242 calculates the decoded value $\hat{X}$ according to Equation 10:

$$\hat{X} = \tilde{X} + E_2 \cdot 2^{p-1} \quad \text{(Equation 10)}$$

Otherwise, if the first error $E_1$ is equal to the second error $E_2$, in block 414, the channel decoder 232/242 equates the decoded value $\hat{X}$ with the decompressed value $\tilde{X}$ (i.e., perform no noise mitigation). However, embodiments or the present disclosure are not limited thereto, and the channel decoder 232/242 may instead bias one side or the other by calculating the decoded value $\hat{X}$ according to Equation 9 or 10. In embodiments in which the values k and p are selected to satisfy the condition of Equation 3, the first and second errors E1 and E2 cannot equal one another. However, this situation may occur when only the condition of Equation 2 is met (and not Equation 3) for some pixels. Violating the condition of Equation 3 may result in some miscorrection, but this scheme provides lower value p for the same value k, which may be desirable in that fewer bits are discarded.

While, according to some embodiments, the protected portion $x_k$ is maintained intact (i.e., not compressed/decompressed) for purposes of noise mitigation, embodiments of the present disclosure are not limited thereto. For example, partial protection may be achieved with multiple replications of the protected portion $x_k$.

Figure 5:
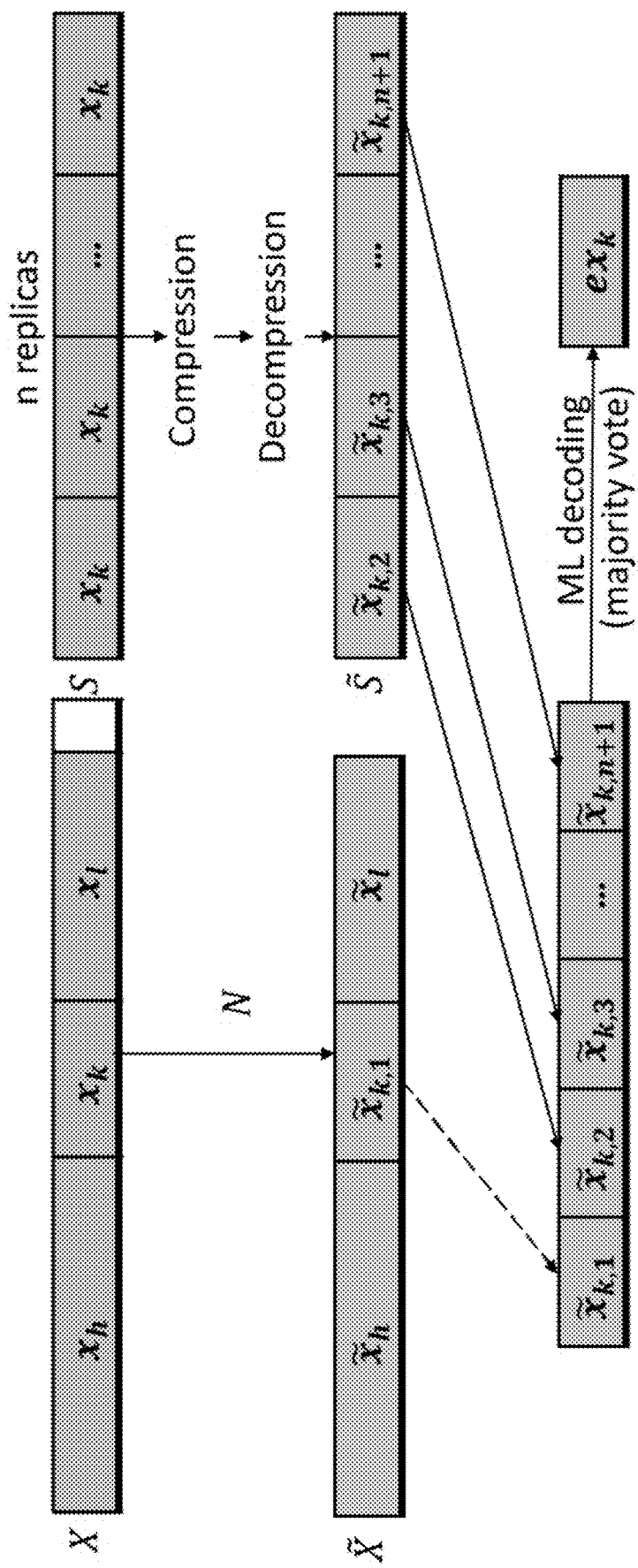
FIG. 5 illustrates a process for mitigating noise through partial protection of bits with multiple replications by the noise mitigation system, according to some example embodiments of the present disclosure.

FIG. 5 illustrates a process for mitigating noise through partial protection of bits with multiple replications by the system 202, according to some embodiments of the present disclosure.

Referring to FIG. 5, rather than maintain the protected portion $x_k$ intact, the channel encoder 222 creates n replicas (n being an integer greater than 1) of the protected portion $x_k$ and combines them together to form a binary replica string S. In some embodiments, the binary replica string S is compressed by compressor 235 and later decompressed by the decompressor 230. The compression and decompression may be the same as those applied to the accumulated brightness value X; however, embodiments of the present disclosure are not limited thereto. For example, the compression and decompression applied to the binary replica string S may be different from those applied to the accumulated brightness value X. For examples, a different compression technique and/or a different compression ratio may be used.

As shown in FIG. 5, each of the decompressed replicas (e.g., $\tilde{x}_{k,2}, \tilde{x}_{k,3}, \ldots \tilde{x}_{k,n+1}$) of the decompressed replica string S experiences a different amount of noise.

In some embodiments, the channel decoder 232/242 applies a maximum likelihood decoding process (MLD, e.g., majority vote) to the decompressed replicas to calculate a decoded protected portion $ex_k$, which is an estimation of the protected portion $x_k$ of the accumulated brightness value. The MLD process may reduce the noise in decoded protected portion $ex_k$, but may not reduce it down to a point where the decoded protected portion $ex_k$ is the same as the protected portion $x_k$. The number n of replicas may be determined based on simulations, experimentation, and/or available memory. In some examples, the number of replicas n is chosen to be an odd number. However, when the number n of replicas is an even number, the compressed portion $\tilde{x}_{k,1}$ may be combined with the binary replica string S to make the total number be an odd number prior to applying the MLD process. Embodiments of the present disclosure are not limited to the MLD process, and any other suitable process may be utilized in its place.

Once the channel decoder 232/242 determines the decoded protected portion $ex_k$, it may proceed to calculate the decoded value $\hat{X}$, as described above with reference to FIG. 4, by replacing $x_k$ with $ex_k$ in Equations 7 and 8.

Figure 6:
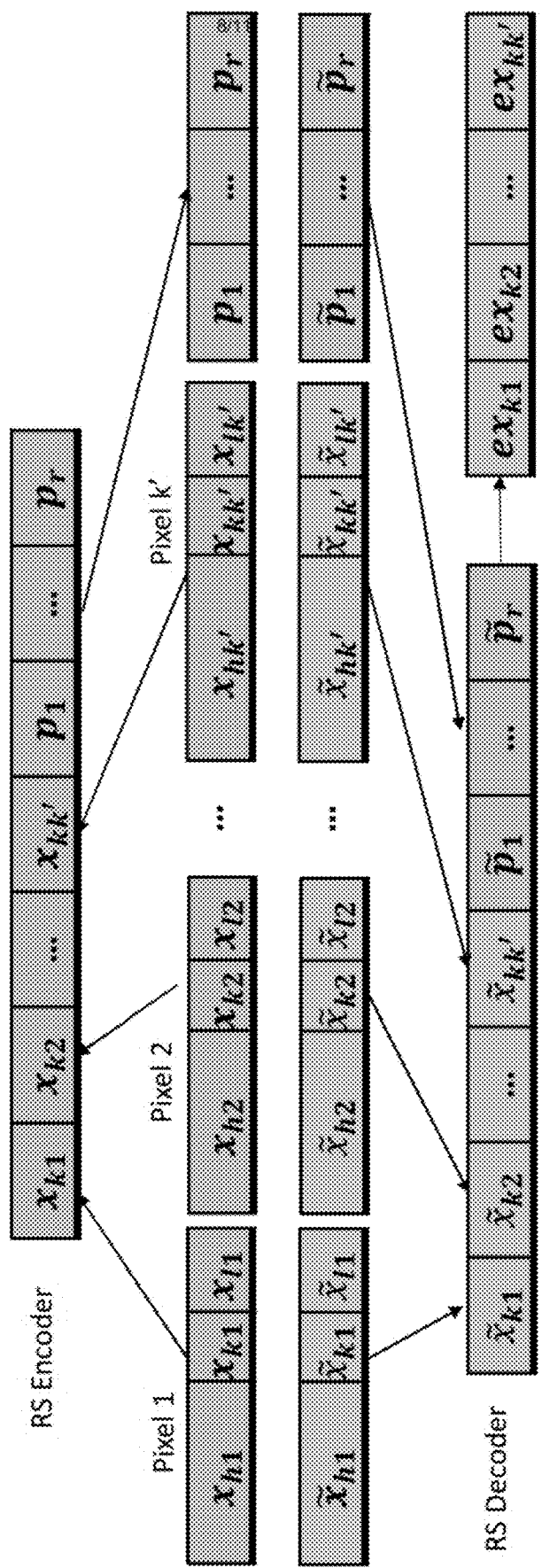
FIG. 6 illustrates a process for mitigating noise through partial protection of bits with reed-solomon code by the noise mitigation system, according to some example embodiments of the present disclosure.

FIG. 6 illustrates a process for mitigating noise through partial protection of bits with dependent encoding of multiple pixels by enhanced coding techniques, such as reed-solomon code, by the system 202, according to some embodiments of the present disclosure. FIGS. 7A-7D illustrate various placement options for the insertion of parity bits into the corresponding accumulated brightness value, according to some embodiments of the present disclosure.

Referring to FIG. 6, the channel encoder 222 may encode the accumulated brightness values X for k' pixels (k' being an integer greater than one), whereby these pixels of the display are within one slice of the image being compressed. According to some examples, the lesser significant portion $x_l$, the protected portion $x_k$, and the more significant portion $x_h$ of these pixels are shown as $x_{l,1} \ldots x_{l,k'}, x_{k,k'}$ and $x_{h,1} \ldots x_{h,k'}$, respectively. The channel encoder 222 then generates parity bits $p_1$ to $P_r$ for the string of bits made up of $x_{k,1} \ldots x_{k,k'}$.

Each of the pixels 1 to k' and the parity bits $p_1$ to $p_r$ are compressed separately or partly together with the compressor 235 or with multiple different compressors and later decompressed by the corresponding decompressor to generate compressed pixels 1 to k' and compressed parity bits $\tilde{p}_1$ to $\tilde{p}_r$. The parity bits $p_1$ to $p_r$ may be compressed with the same or different compressions (e.g., same or different compression technique, compression ratio, compression parameter, etc.) as the string of bits $x_{k,1} \ldots x_{k,k'}$. The compressed parity bits $\tilde{p}_1$ to $\tilde{p}_r$ are then used by the channel decoder 232/242 to generate the values $\hat{x}_{k,1} \ldots \hat{x}_{k,k'}$ from the $\tilde{x}_{k,1} \ldots \tilde{x}_{k,k'}$. These values are then used by the channel decoder 232/242 to estimate the values $x_{k,1} \ldots x_{k,k'}$, which can be used to mitigate noise as described above with reference to FIGS. 3-4.

According to some embodiments, the parity bits $\tilde{p}_1$ to $\tilde{p}_r$ may be appended/interleaved at any point in the accumulated brightness value. For example, the parity bits $\tilde{p}_1$ to $\tilde{p}_r$ may be appended to the end of the accumulated brightness value (as, e.g., shown in FIG. 7A), may be appended to the beginning of the accumulated brightness value (as, e.g., shown in FIG. 7B), may be appended to somewhere between the LSB and MSB of the accumulated brightness value (as, e.g., shown in FIG. 7C), or may be interleaved with the bits of the accumulated brightness value (as, e.g., shown in FIG. 7D).

In the embodiments described above, the values p and k are fixed and are based on an estimation or knowledge of the noise. However, due to the recursive structure of the system 202, the noise is not fixed and is accumulated over time. As a result, the chosen values p and k may be too aggressive at the beginning.

As such, it may be desirable to adaptively select the values p and k to more closely match the noise level at each successive iteration/run. Each of the iterations/runs may correspond to a frame of images displayed at the display device. In some examples, each successive frame may correspond to a successive iteration. In other examples, one iteration may be performed for every m frames (m being an integer greater than 1). The latter approach may reduce the demands on memory and computation time.

Adaptive parameters allow for easy parameter initialization, as parameters that are inappropriate can be corrected in successive executions. Further, with adaptive parameters may offer better performance at the beginning and therefore allow for less error accumulation during the early runs. Furthermore, no knowledge of the noise is required.

Because the accumulated noise starts out small but grows over time (i.e., starts from a least significant bit (LSB) and moves toward a most significant bit (MSB)), it is desired to choose a smaller value for p+k (also referred to as the sum parameter c) at the beginning. According to some embodiments of adaptive parameter selection, the value k is kept constant. Therefore the value of p increases over time (e.g., from an LSB toward an MSB).

Figure 8A:
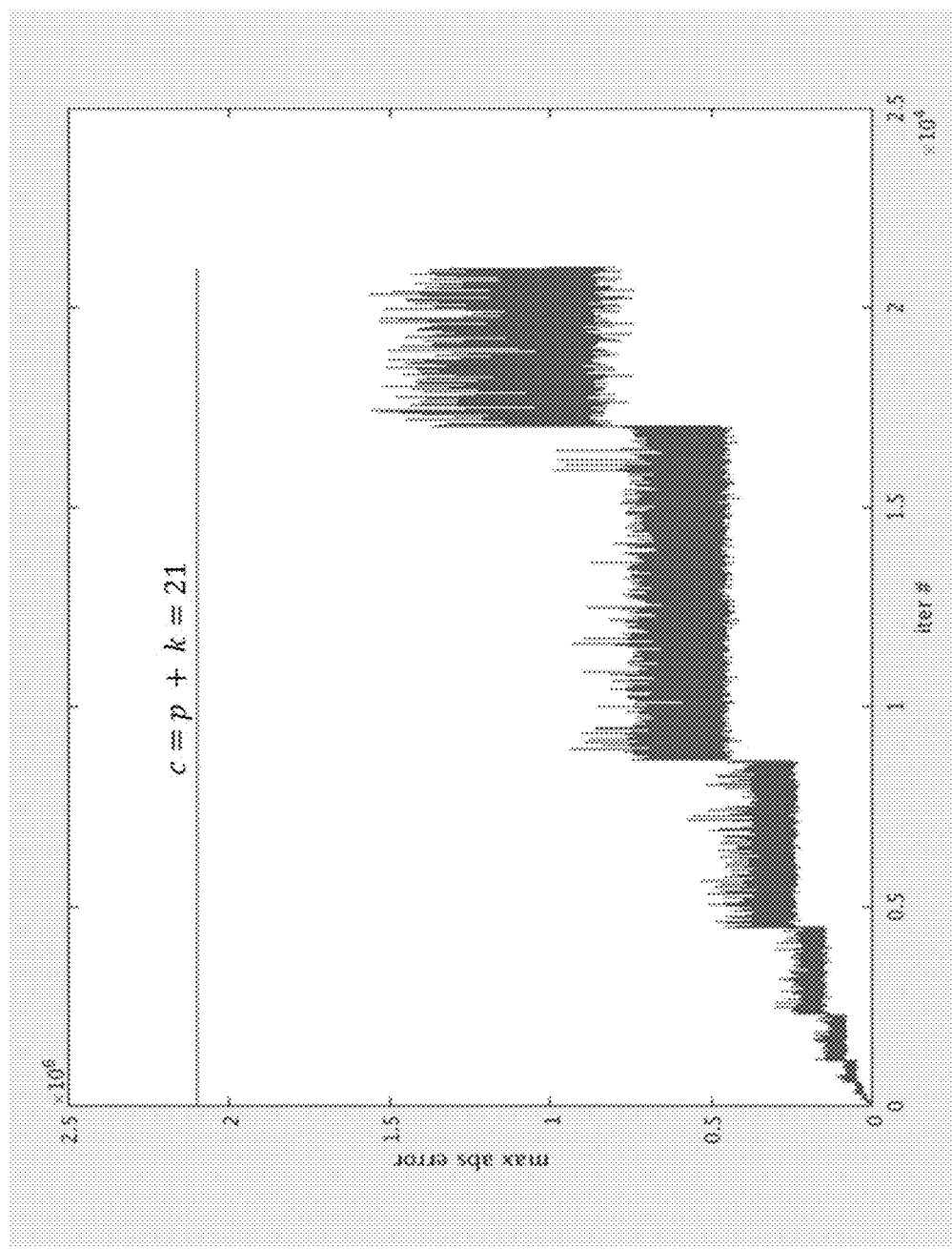
FIGS. 8A-8B are diagrams illustrating the maximum absolute error versus number of iterations of the recursive system 202, according to some example embodiments of the present disclosure.
Figure 8B:
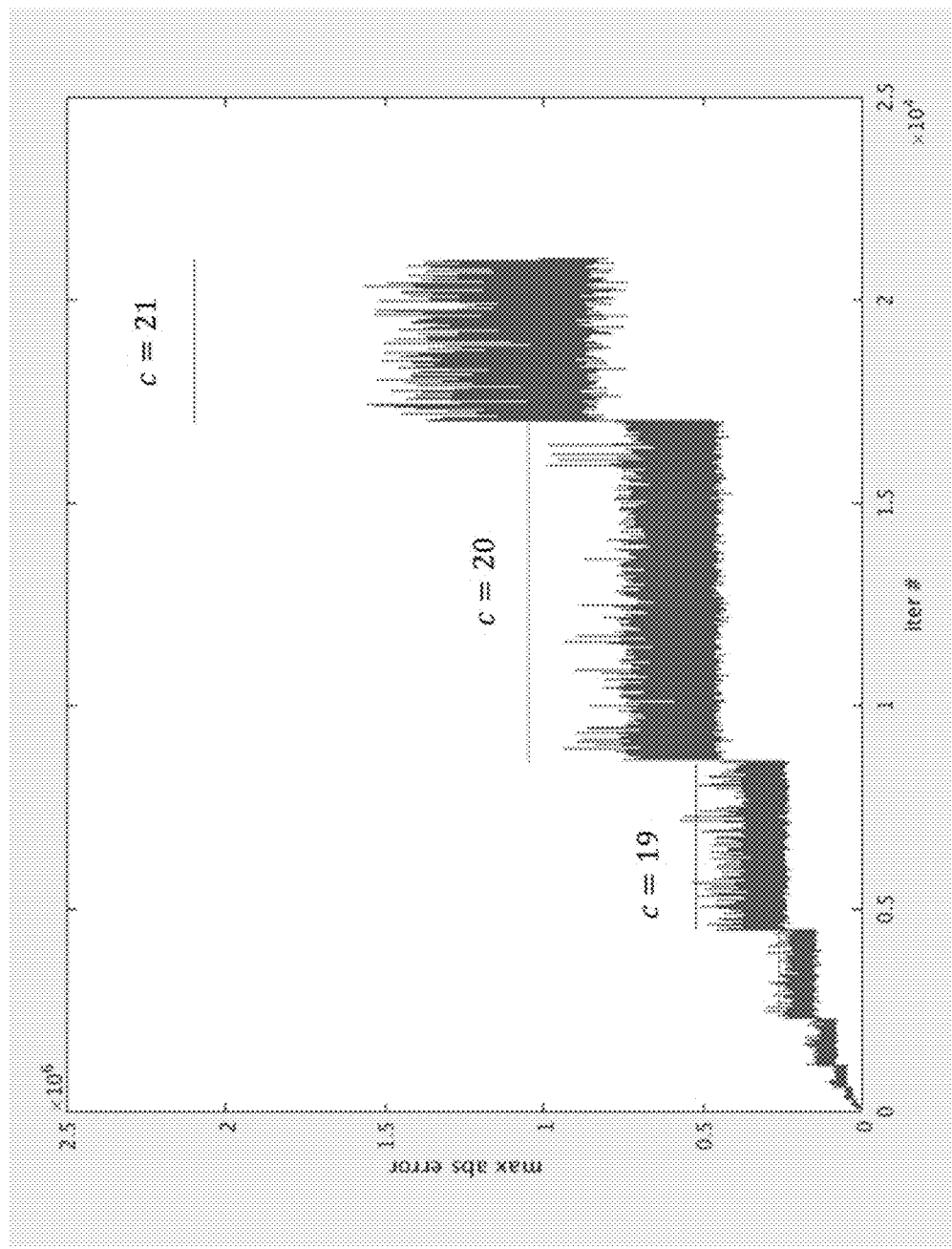

FIGS. 8A-8B are diagrams illustrating the maximum absolute error versus number of iterations of the recursive system 202, according to some example embodiments of the present disclosure. FIGS. 8A-8B, illustrate the step-like characteristic of the accumulated compression quantization noise.

FIG. 8A illustrates noise mitigation using a fixed sum parameter c (=p+k). FIG. 8B illustrates adaptive noise mitigation using a varying sum parameter c. Further, the appropriate value of the sum parameter c at each step is shown in FIG. 8B. In the example of FIG. 8B, the sum parameter c is increased in increments of one.

According to some examples, the data accumulation, and hence the noise accumulation, may continue for a long period of time (e.g., months or years), and the sum parameter c may be updated at intervals (e.g., regular intervals, such as once every few weeks or months). Thus, the changes to the sum parameter c may be relatively infrequent. As a result, even though the noise calculations for one iteration after an increment of the sum parameter c may be off (e.g., incorrect), this error is diluted by the number of iterations using the correct value of C, and hence there is no discernable effect on the image quality of the display.

There may be two methods for adaptively changing the sum value c: (1) setting/adjusting the sum value c by the compressor 235 and communicating the value c to the channel encoder 222 and decoders 232 and 242, and (2) setting/adjusting the sum value c by one or more of the channel encoder 222 and decoders 232 and 242 using information available to the encode/decoder and communicating the value of c to the other one(s) of the encoder and decoders. The second approach may be referred to as self-adaptive.

Under the first approach, the compressor 235 may utilize a quantization table (which may be different from the stress profile table maintained in the memory 205) and, in some examples, the incrementing of c happens when compression quantization changes (as represented by the step changes in FIG. 8B). In this case, the compressor 235 signals to the channel encoder and decoder to increment the sum value c whenever the quantization level is changed. The quantization levels and their correspondence to c may be based on experiential numbers or theoretical calculations.

Under the second, i.e., self-adaptive, approach, according to some embodiments, the channel decoder 232/242 observes the value of $|\tilde{x}_k - x_k|$, which represents the noise added to the protected portion $x_k$, and when it determines that the value of $|\tilde{k}_k - x_k|$ is invalid (i.e., exceeds a noise threshold), it increments the sum value c by one. The noise threshold may be defined based on the values of p and k and the iteration number (or time).

According to some embodiments, when one of the first and second channel decoders 232 and 242 changes the sum value c, it communicates the change to the other channel decoder so that there is no noise caused by mismatched c. However, in examples in which the first and second channel decoders 232 and 242 do not communicate the change in the sum value c, when one decoder changes the value c, it causes mismatch noise in the other decoder; however, the other decoder may detect the mismatched c by utilizing the same self-adaptive logic leveraging on the additional noise due to mismatched c, and increment the sum value c by one.

In some embodiments, in order to avoid large correction errors, noise mitigation is not performed by the channel encoder 222 and decoders 232 and 242 when the sum value of c is changed.

Given that incrementing the sum value c often occurs when there is a step change in quantization noise, in some embodiments, instead of the channel encoders/decoders self-adjusting the sum value c, the compression block (i.e., the compressor 235) adjusts the value of c when there is a change in quantization noise and communicates the change to the channel encoder 222 and decoders 232 and 242. Here, the decision to change c may be made in the same manner as that of the self-adaptive approach.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Although exemplary embodiments of a system and a method for mitigating the effects of compression errors have been specifically described and illustrated herein, many modifications and variations will be apparent to those skilled in the art. Accordingly, it is to be understood that to a system and a method for mitigating the effects of compression errors using stress profile compression constructed according to principles of this disclosure may be embodied other than as specifically described herein. The scope of the present disclosure is defined by the following claims, and equivalents thereof.

What is claimed is:

1. A method of stress compensation in a display device, the method comprising:
    augmenting, by an adding circuit, a brightness value of an image displayed by the display device based on a previous decoded value to generate an accumulated brightness value;
    encoding, by an encoder, the accumulated brightness value by selecting, for preservation in a memory, a protected portion of the accumulated brightness value, the protected portion comprising a plurality of bits from among bits of the accumulated brightness value;
    compressing, by a compressor, the accumulated brightness value;
    storing, by the compressor, the compressed accumulated brightness value in the memory;
    retrieving and decompressing, by a decompressor, the compressed accumulated brightness value to generate a decompressed value;
    decoding, by a decoder, the decompressed value based on the protected portion to generate a decoded value corresponding to the accumulated brightness value, the decoded value having lower compression noise than the decompressed value;
    receiving, by the adding circuit, an output image to be displayed on the display device; and
    adding, by the adding circuit, the decoded value to a brightness value of the output image to generate an updated accumulated brightness value.

2. The method of claim 1, wherein the protected portion comprises k bits of the accumulated brightness value starting from a p-th bit of the accumulated brightness value (both p and k being integers greater than 1), and
    wherein p+k−1 is less than a bit length of the accumulated brightness value.

3. The method of claim 2, wherein the compression noise in the decompressed value is entirely contained within first (p+k−1)-th bits of the decompressed value.

4. The method of claim 1, further comprising:
    discarding, by a truncator, lesser significant bits of the decoded value preceding the protected portion.

5. The method of claim 1, further comprising:
    providing the decoded value to a compensator for compensating an input image for a stress of the display device.

6. The method of claim 1, wherein the encoding the accumulated brightness value comprises:
    identifying, by the encoder, the protected portion of the accumulated brightness value; and
    storing, by the encoder, the protected portion in the memory.

7. The method of claim 6, wherein the protected portion is stored in memory in an uncompressed state.

8. The method of claim 1, wherein the decoding the decompressed value comprises:
    identifying, by the decoder, a decompressed protected portion of the decompressed value;
    calculating, by the decoder, a difference between the protected portion and the decompressed protected portion to generate an estimated compression noise; and
    calculating, by the decoder, the decoded value based on the decompressed value and the estimated compression noise to mitigate compression noise in the decompressed value.

9. The method of claim 8, wherein the decompressed protected portion of the decompressed value corresponds in bit position to the protected portion of the accumulated brightness value.

10. The method of claim 8, wherein the calculating the difference comprises:
    calculating, by the decoder, a first error ($E_1$) and a second error ($E_2$) as:

$$E_1 = (\tilde{k}_k - x_k) \bmod 2^k, \text{ and}$$

$$E_2 = (x_k - \tilde{x}_k) \bmod 2^k$$

where $X_k$ represents the protected portion of the accumulated brightness value, $\tilde{x}_k$ represents the decompressed protected portion, and mod represents a modulo operation.

11. The method of claim 10, wherein calculating the decoded value comprises:

determining, by the decoder, that the first error is less than the second error; and in response to the determination, calculating, by the decoder, the decoded value ($\hat{X}$) as $$\hat{X}=\tilde{X}-E_1\cdot 2^{p-1}$$

where $\tilde{X}$ represents the decompressed value and p represents a first bit location of the protected portion in the accumulated brightness value.

12. The method of claim 10, wherein calculating the decoded value comprises:

determining, by the decoder, that the first error is greater than the second error; and in response to the determination, calculating, by the decoder, the decoded value ($\hat{X}$) as $$\hat{X}=\tilde{X}-E_2\cdot 2^{p-1}$$

where $\tilde{X}$ represents the decompressed value and p represents a first bit location of the protected portion in the accumulated brightness value.

13. The method of claim 10, wherein calculating the decoded value comprises:

determining, by the decoder, that the first error is equal to the second error; and determining, by the decoder, the decoded value as the decompressed value.

14. The method of claim 1, wherein the encoding the accumulated brightness value comprises:

replicating, by the encoder, the protected portion of a plurality of times to form a binary replica string, and wherein the method further comprises:

compressing, by the compressor, the binary replica string;

storing, by the compressor, the compressed binary replica string in the memory; and retrieving and decompressing, by the decompressor, the compressed binary replica string to generate a decompressed binary replica string.

15. The method of claim 14, wherein the decoding the decompressed value comprises:

calculating, by the decoder, a decoded protected portion to estimate the protected portion by applying a maximum likelihood decoding (MLD) process to the decompressed binary replica string;

calculating, by the decoder, a difference between the decoded protected portion and a decompressed protected portion of the decompressed value to generate an estimated compression noise; and calculating, by the decoder, the decoded value based on the decompressed value and the estimated compression noise to mitigate compression noise in the decompressed value.

16. The method of claim 1, wherein the encoding the accumulated brightness value comprises:

coding, by the encoder, the protected portion to generate a plurality of parity bits, wherein the compressing the accumulated brightness value comprises:

compressing, by the compressor, the parity bits along with the accumulated brightness value, and wherein the decompressing the compressed accumulated brightness value comprises:

decompressing, by the decompressor, the compressed parity bits together with the compressed accumulated brightness value to generate a decompressed protected portion and decompressed parity bits.

17. The method of claim 16, wherein the coding of the protected portion is according to a reed-solomon code applied across slices of the accumulated brightness value, and wherein the parity bits are compressed via a different compression than the accumulated brightness value.

18. The method of claim 16, wherein the decoding the decompressed value comprises:

calculating, by the decoder, a decoded protected portion to estimate the protected portion based on the decompressed protected portion and decompressed parity bits;

calculating, by the decoder, a difference between the decoded protected portion and the decompressed protected portion to generate an estimated compression noise; and calculating, by the decoder, the decoded value based on the decompressed value and the estimated compression noise to mitigate compression noise in the decompressed value.

19. A system for performing stress compensation in a display device, the system comprising:

a memory; and a processing circuit comprising an adding circuit, the processing circuit being configured to perform:

augmenting, by an adding circuit, a brightness value of an image displayed by the display device based on a previous decoded value to generate an accumulated brightness value;

encoding the accumulated brightness value by selecting, for preservation in the memory, a protected portion of the accumulated brightness value, the protected portion comprising a plurality of bits from among bits of the accumulated brightness value;

compressing the accumulated brightness value;

storing the compressed accumulated brightness value in the memory;

retrieving and decompressing the compressed accumulated brightness value to generate a decompressed value;

decoding the decompressed value based on the protected portion to generate a decoded value corresponding to the accumulated brightness value, the decoded value having lower compression noise than the decompressed value;

receiving, by the adding circuit, an output image to be displayed on the display device; and adding, by the adding circuit, the decoded value to a brightness value of the output image to generate an updated accumulated brightness value.

* * * * *